US008352242B2

United States Patent
Schmitt et al.

(10) Patent No.: US 8,352,242 B2
(45) Date of Patent: Jan. 8, 2013

(54) COMMUNICATION SCHEME BETWEEN PROGRAMMABLE SUB-CORES IN AN EMULATION ENVIRONMENT

(75) Inventors: Peer Schmitt, Paris (FR); Philippe Diehl, Versailles (FR); Charles Selvidge, Waltham, MA (US)

(73) Assignee: Mentor Graphics Corporation, Wilsonville, OR (US)

( * ) Notice: Subject to any disclaimer, the term of this patent is extended or adjusted under 35 U.S.C. 154(b) by 408 days.

(21) Appl. No.: 12/094,401

(22) PCT Filed: Feb. 21, 2007

(86) PCT No.: PCT/EP2007/051652
§ 371 (c)(1),
(2), (4) Date: May 20, 2008

(87) PCT Pub. No.: WO2007/096376
PCT Pub. Date: Aug. 30, 2007

(65) Prior Publication Data
US 2008/0288236 A1    Nov. 20, 2008

Related U.S. Application Data

(60) Provisional application No. 60/775,595, filed on Feb. 21, 2006.

(51) Int. Cl.
*G06F 9/455* (2006.01)
(52) U.S. Cl. .......................... 703/28; 703/23
(58) Field of Classification Search .............. 703/23, 703/28; 716/128
See application file for complete search history.

(56) References Cited

U.S. PATENT DOCUMENTS

| 4,697,241 A | 9/1987 | Lavi |
| 4,870,302 A | 9/1989 | Freeman |
| 5,036,473 A | 7/1991 | Butts et al. |
| 5,109,353 A | 4/1992 | Sample et al. |
| 5,259,006 A | 11/1993 | Price et al. |
| 5,551,013 A | 8/1996 | Beausoleil et al. |
| 5,596,742 A | 1/1997 | Agarwal et al. |
| 5,621,650 A | 4/1997 | Agrawal |
| 5,649,176 A | 7/1997 | Selvidge et al. |
| 5,659,716 A | 8/1997 | Selvidge et al. |
| 5,701,111 A | 12/1997 | Trimberger |

(Continued)

FOREIGN PATENT DOCUMENTS

WO    WO 01/24066    4/2001

(Continued)

OTHER PUBLICATIONS

Noguiero, International Search Report for PCT/EP2007/051652, Jun. 19, 2007.

(Continued)

*Primary Examiner* — Eunhee Kim
(74) *Attorney, Agent, or Firm* — Klarquist Sparkman, LLP (57) ABSTRACT

A system and method are disclosed for communicating in a programmable core. The programmable core is within a single integrated circuit and is divided into multiple independent sub-cores. The sub-cores are coupled together using a multiplexer based network. In another aspect, the multiplexer-based network includes multiplexers associated with some of the sub-cores for sending data and demultiplexers associated with other sub-cores for receiving data. In yet another aspect, a clock is included in the multiplexer-based network for synchronizing communication between the multiplexers and demultiplexers.

11 Claims, 7 Drawing Sheets

U.S. PATENT DOCUMENTS

| | | | |
|---|---|---|---|
| 5,761,484 | A | 6/1998 | Agarwal et al. |
| 5,802,348 | A | 9/1998 | Stewart et al. |
| 5,847,578 | A | 12/1998 | Noakes et al. |
| 5,850,537 | A | 12/1998 | Selvidge et al. |
| 5,854,752 | A | 12/1998 | Agarwal |
| 5,887,158 | A * | 3/1999 | Sample et al. ............... 716/15 |
| 5,943,490 | A | 8/1999 | Sample |
| 5,960,191 | A | 9/1999 | Sample et al. |
| 6,009,531 | A | 12/1999 | Selvidge et al. |
| 6,051,030 | A | 4/2000 | Beausoleil et al. |
| 6,167,559 | A * | 12/2000 | Furtek et al. ............... 326/41 |
| 6,961,691 | B1 | 11/2005 | Selvidge et al. |
| 7,379,859 | B2 * | 5/2008 | Goode ............... 703/25 |
| 2002/0161568 | A1 | 10/2002 | Sample et al. |
| 2003/0025132 | A1* | 2/2003 | Tobey ............... 257/202 |
| 2006/0168396 | A1* | 7/2006 | LaMothe et al. ............... 711/113 |

FOREIGN PATENT DOCUMENTS

WO    WO 02/086723    10/2002

OTHER PUBLICATIONS

International Preliminary Report on Patentability, PCT/EP2007/051652, (Aug. 26, 2008).

Written Opinion of the International Searching Authority, PCT/EP2007/051652.

Babb et al., "Logic Emulation with Virtual Wires," *IEEE Transactions on Computer-Aided Design of Integrated Circuits and Systems*, vol. 16, No. 6, Jun. 1997, pp. 609-626.

Babb, "Virtual Wires: Overcoming Pin Limitations in FPGA-based Logic Emulation," Masters Thesis, *Massachusetts Institute of Technology, Department of Electrical Engineering and Computer Science*, Nov. 15, 1993, 102 pages.

Babb et al., "Virtual Wires: Overcoming Pin Limitations in FPGA-based Logic Emulators," *Proceedings of IEEE Workshop on FPGAs for Custom Computing Machines*, Apr. 1993, pp. 142-151.

Babb et al., "Virtual Wires: Overcoming Pin Limitations in FPGA-based Logic Emulators," *Massachusetts Institute of Technology, Student Workshop on Scalable Computing*, Aug. 1993, 2 pages.

Dahl et al, "Emulation of the Sparcle Microprocessor with the MIT Virtual Wires Emulation System," *IEEE Workshop on FPGAs for Custom Computing Machines*, Apr. 1994, pp. 14-22.

Feng, "A Survey of Interconnection Networks," *Computer*, vol. 14, Issue 12, Dec. 1981, pp. 12-27.

Hasan et al., "Fast Partitioning Method for PLA-Based Architectures," *Proceedings of Fourth Annual IEEE International ASIC Conference and Exhibit*, Sep. 1991, P2-3/1-4.

Li et al., "Routability Improvement Using Dynamic Interconnect Architecture," *IEEE Transactions on Very Large Scale Integration (VLSI ) Systems*, vol. 6, Issue 3, Sep. 1998, pp. 498-501.

Roy, "A New Approach to the Problem of PLA Partitioning Using the Theory of the Principle Latice of Partitions of a Submodular Function," *Proceedings of the Fourth Annual IEEE International ASIC Conference and Exhibit*, Sep. 1991, 4 pages.

Tessier et al., "The Virtual Wires Emulation System: A Gate-Efficient ASIC Prototyping Environment," *ACM Workshop on FPGA's*, Feb. 1994, 9 pages.

Tessier et al., "The Virtual Wires Emulation System; A Gate-Efficient ASIC Prototyping Environment," *MIT Student Workshop on Scalable Computing*, Jul. 1994, 2 pages.

Varghese et al., "An Efficient Logic Emulation System," *IEEE Transactions on Very Large Scale Integration (VLSI) Systems*, vol. 1, Issue 2, pp. 171-174, Jun. 1993.

Arnold et al., "Splash 2," *Proccedings of the fourth annual ACM symposium on Parallel algorithms and architectures*, Jun. 29-Jul. 1, 1992, pp. 316-322.

Babb et al., "Virtual Wires: Overcoming Pin Limitations in FPGA-based Logic Emulators," *Proceedings IEEE Workshop on FPGAs for Custom Computing Machines*, Apr. 5, 1993, pp. 142-151.

Dally, "Virtual-Channel Flow Control," *IEEE Transactions on Parallel and Distributed Systems* . vol. 3, No. 2, Mar. 1992, pp. 194-205.

Gokhale et al., "Building and Using a Highly Parallel Progammable Logic Array," *Computer*, vol. 24, Issue 1, Jan. 1991, pp. 81-89.

Van Den Bout, et al., "AnyBoard: An FPGA-Based Reconfigurable System," *IEEE Computer Society*, Sep. 1992, pp. 21-29.

* cited by examiner

COMMUNICATION SCHEME BETWEEN PROGRAMMABLE SUB-CORES IN AN EMULATION ENVIRONMENT

CROSS REFERENCE TO RELATED APPLICATIONS

This is a 35 U.S.C. §371 U.S. National Stage of International Application No. PCT/EP2007/051652, filed Feb. 21, 2007, which was published in English under PCT Article 21(2), which in turn claims the benefit of U.S. Provisional Application No. 60/775,595, filed Feb. 21, 2006. Both applications are incorporated herein in their entirety.

FIELD OF THE INVENTION

The present invention generally relates to hardware emulators, and more particularly to communication between programmable sub-cores in a hardware emulator.

BACKGROUND

Today's sophisticated SoC (System on Chip) designs are rapidly evolving and nearly doubling in size with each generation. Indeed, complex designs have nearly exceeded 50 million gates. This complexity, combined with the use of devices in industrial and mission-critical products, has made complete design verification an essential element in the semiconductor development cycle. Ultimately, this means that every chip designer, system integrator, and application software developer must focus on design verification.

Hardware emulation provides an effective way to increase verification productivity, speed up time-to-market, and deliver greater confidence in the final SoC product. Even though individual intellectual property blocks may be exhaustively verified, previously undetected problems appear when the blocks are integrated within the system. Comprehensive system-level verification, as provided by hardware emulation, tests overall system functionality, IP subsystem integrity, specification errors, block-to-block interfaces, boundary cases, and asynchronous clock domain crossings. Although design reuse, intellectual property, and high-performance tools all help by shortening SoC design time, they do not diminish the system verification bottleneck, which consumes 60-70% of the design cycle. As a result, designers can implement a number of system verification strategies in a complementary methodology including software simulation, simulation acceleration, hardware emulation, and rapid prototyping. But, for system-level verification, hardware emulation remains a favorable choice due to superior performance, visibility, flexibility, and accuracy.

A short history of hardware emulation is useful for understanding the emulation environment. Initially, software programs would read a circuit design file and simulate the electrical performance of the circuit very slowly. To speed up the process, special computers were designed to run simulators as fast as possible. IBM's Yorktown "simulator" was the earliest (1982) successful example of this—it used multiple processors running in parallel to run the simulation. Each processor was programmed to mimic a logical operation of the circuit for each cycle and may be reprogrammed in subsequent cycles to mimic a different logical operation. This hardware 'simulator' was faster than the current software simulators, but far slower than the end-product ICs. When Field Programmable Gate Arrays (FPGAs) became available in the mid-80's, circuit designers conceived of networking hundreds of FPGAs together in order to map their circuit design onto the FPGAs and the entire FPGA network would mimic, or emulate, the entire circuit. In the early 90's the term "emulation" was used to distinguish reprogrammable hardware that took the form of the design under test (DUT) versus a general purpose computer (or work station) running a software simulation program.

Soon, variations appeared. Custom FPGAs were designed for hardware emulation that included on-chip memory (for DUT memory as well as for debugging), special routing for outputting internal signals, and for efficient networking between logic elements. Another variation used custom IC chips with networked single bit processors (so-called processor based emulation) that processed in parallel and usually assumed a different logic function every cycle.

Physically, a hardware emulator resembles a large server. Racks of large printed circuit boards are connected by backplanes in ways that most facilitate a particular network configuration. A workstation connects to the hardware emulator for control, input, and output.

Before the emulator can emulate a DUT, the DUT design must be compiled. That is, the DUT's logic must be converted (synthesized) into code that can program the hardware emulator's logic elements (whether they be processors or FPGAs). Also, the DUT's interconnections must be synthesized into a suitable network that can be programmed into the hardware emulator. The compilation is highly emulator specific and can be time consuming.

Emulators contain a network of crossbar switches to facilitate communication between the different emulator components. A crossbar switch is an interconnect device that receives multiple inputs and maps the inputs to any of its desired outputs. For example, a 32×32 crossbar switch may be programmed to connect any of its 32 inputs to any of its 32 outputs. A crossbar switch may be used for inter-chip communication within the emulator, but also intra-chip to allow communication between components within a chip.

Although the tendency in the electronics industry is to provide smaller and smaller wires, in certain applications it is desirable to use larger wires. Larger wires offer less resistance and, consequently, are faster. Unfortunately, larger wires also increase cross-talk and require more spacing with respect to neighboring wires. The larger wires are particularly problematic with interconnections within a crossbar switch. More specifically, when using larger wires, the number of larger wires and the required spacing there between make the crossbar switch impractical.

Thus, a new communication scheme is needed in an emulation environment that lessens the dependency on crossbar switches.

SUMMARY

A system and method are disclosed for communicating in a programmable core. The programmable core is within a single integrated circuit and is divided into multiple independent sub-cores. The sub-cores are coupled together using a multiplexer-based network.

In another aspect, the multiplexer-based network includes multiplexers associated with some of the sub-cores for sending data and demultiplexers associated with other sub-cores for receiving data.

In another aspect, the programmable core is an FPGA core.

In yet another aspect, a clock is included in the multiplexer-based network for synchronizing communication between the multiplexers and demultiplexers.

These features and others of the described embodiments will be more readily apparent from the following detailed description, which proceeds with reference to the accompanying drawings.

DETAILED DESCRIPTION

Figure 1:
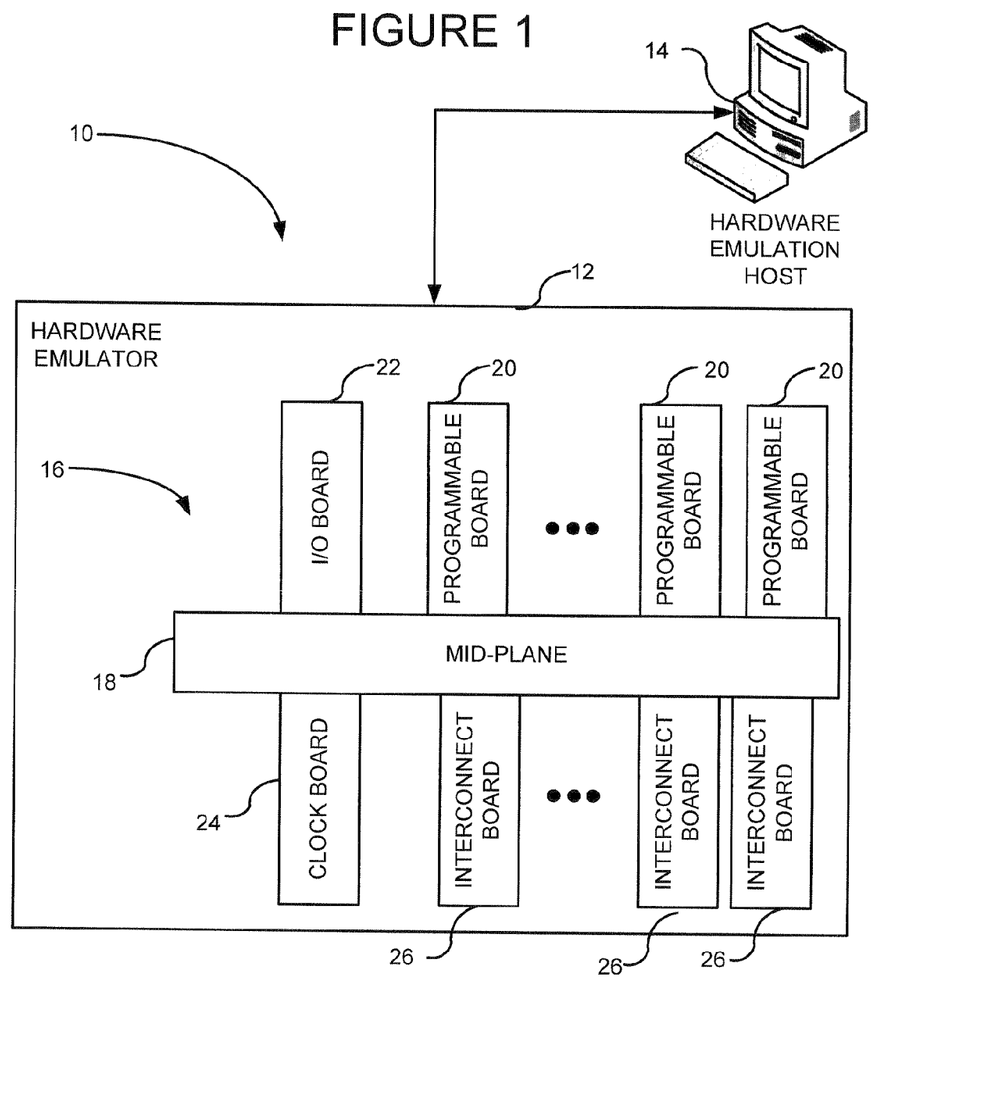
FIG. 1 is a system diagram of a hardware emulator environment including a plurality of printed circuit boards.

FIG. 1 shows an emulator environment 10 including a hardware emulator 12 coupled to a hardware emulator host 14. The emulator host 14 may be any desired type of computer hardware and generally includes a user interface through which a user can load, compile and download a hardware design to the emulator 12 for emulation.

The emulator 12 includes multiple printed circuit boards 16 coupled to a midplane 18. The midplane 18 allows physical connection of the printed circuit boards into the emulator 12 on both sides of the midplane. A backplane may also be used in place of the midplane, the backplane allowing connection of printed circuit boards on one side of the backplane. Any desired type of printed circuit boards may be used. For example, programmable boards 20 generally include an array of FPGAs, or other programmable circuitry, that may be programmed with the user's design downloaded from the emulator host 14. One or more I/O boards 22 allow communication between the emulator 12 and hardware external to the emulator. For example, the user may have a preexisting processor board that is used in conjunction with the emulator and such a processor board connects to the emulator through I/O board 22. Clock board 24 generates any number of desired clock signals. And interconnect boards 26 allow integrated circuits on the programmable boards 20 to communicate together and with integrated circuits on the I/O boards 22.

Figure 2:
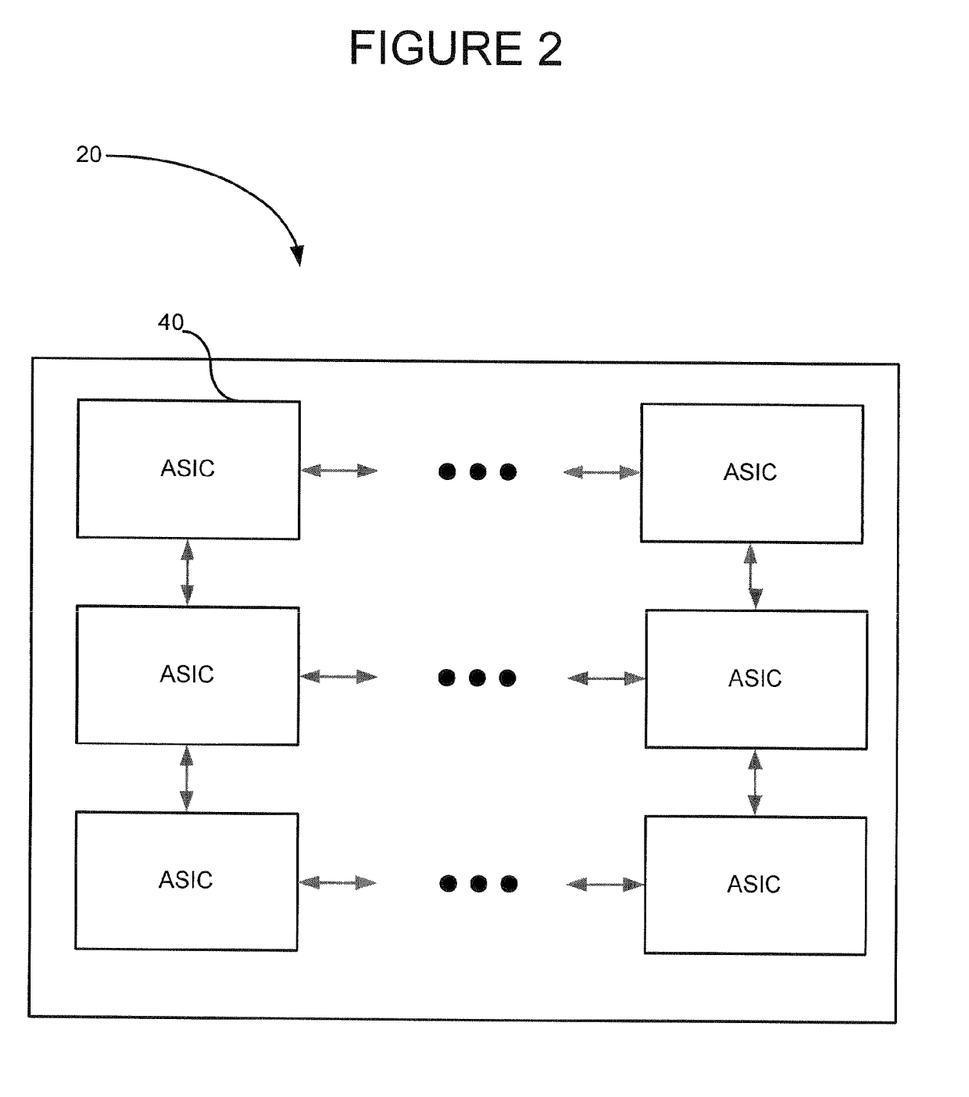
FIG. 2 is a diagram showing multiple ASICS on a printed circuit board of FIG. 1.

FIG. 2 shows further details of one of the programmable boards 20 as including a plurality of Application Specific Integrated Circuits (ASICS) 40 arranged in columns and rows. As further described below, the ASICS include a programmable portion (e.g., an FPGA core) that is programmed with a user design to be emulated. The programmable board may include, instead of ASICS, programmable ICs, such as FPGAs.

Figure 3:
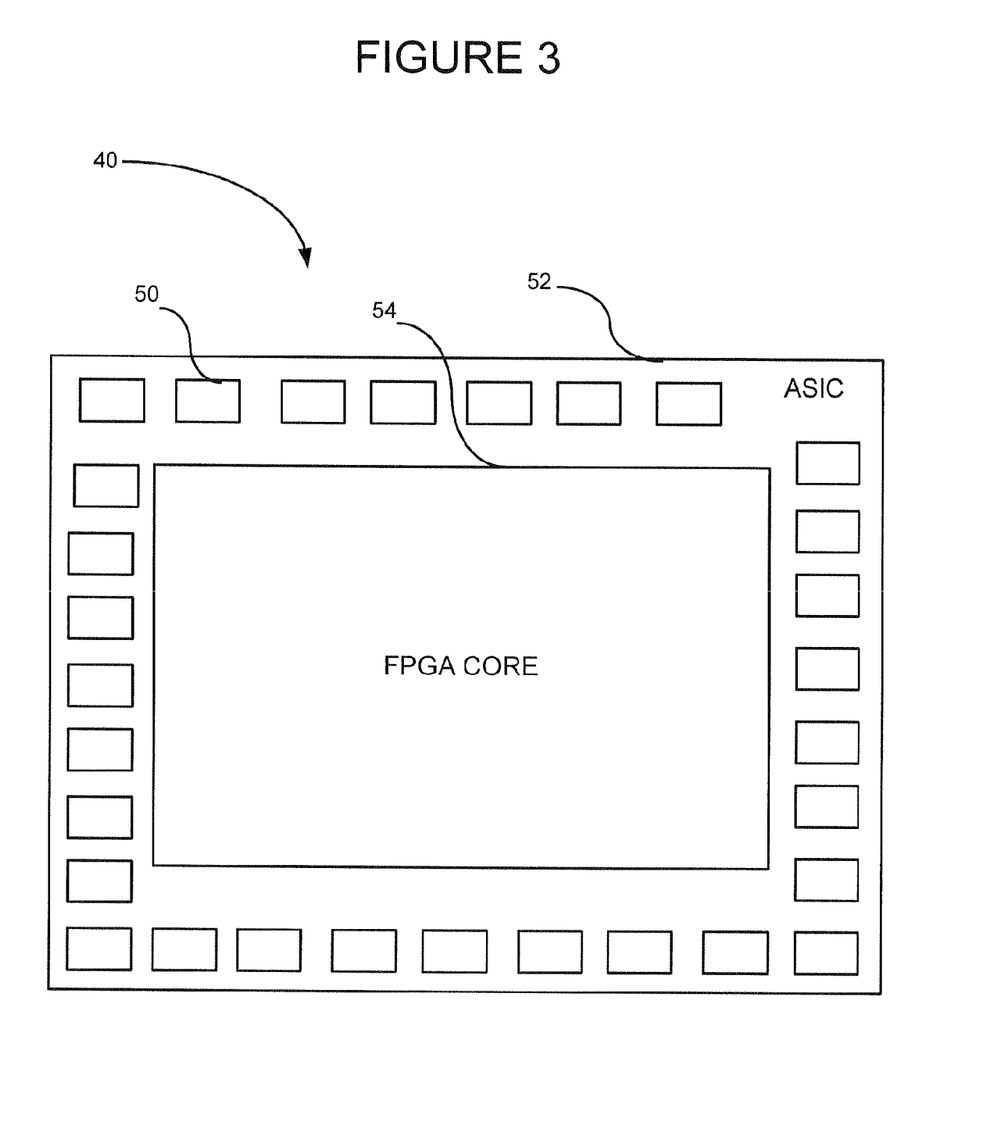
FIG. 3 shows further details of an ASIC as including an FPGA core.

FIG. 3 shows further details of one of the ASICS 40. Each ASIC includes a plurality of pins 50 for physically and electrically connecting the ASIC package 52 (e.g., any type of surface mount or through hole package types) to the programmable board 20. The ASIC also includes an FPGA core 54 that is programmable with the user design. The FPGA is a semiconductor device containing programmable logic and programmable interconnects between the logic.

Figure 4:
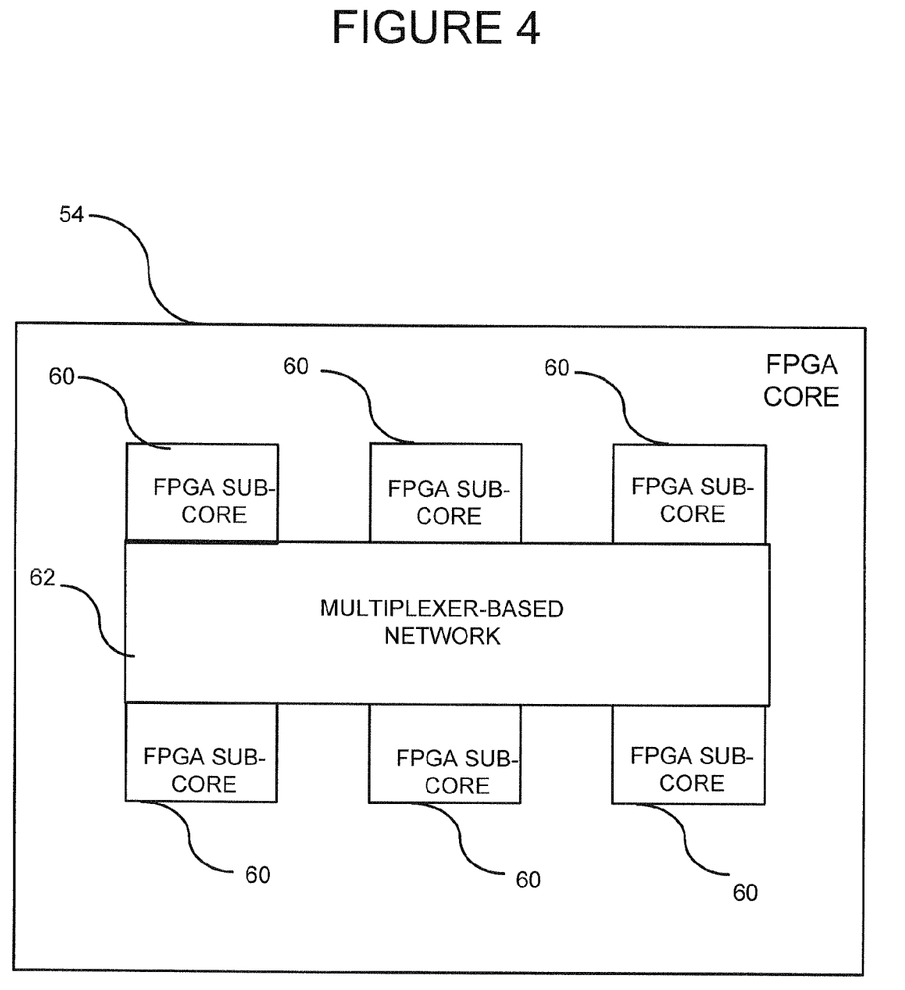
FIG. 4 shows that the FPGA core can include multiple sub-cores coupled together by a multiplexer-based network.

FIG. 4 shows further details of the FPGA core 54. The FPGA core may be formed of a single die and includes multiple sub-cores 60 communicating together through a multiplexer-based network 62. A typical FPGA core includes millions of programmable gates and interconnects. A wire from any part of the FPGA core can be coupled through programmable gates to any other part of the FPGA core on the same die. Instead, FIG. 4 shows that the FPGA core includes multiple sub-cores. Although six sub-cores are shown, any number of sub-cores may be included in the design. Each sub-core 60 acts like an independent FPGA core. Indeed any logic element in an FPGA sub-core can be coupled to another logic element in the same sub-core through programmable interconnects. However, elements between sub-cores cannot be coupled together through programmable gates as in standard FPGAs. Instead, elements between sub-cores can only communicate through the multiplexer-based network 62. As described further below, the multiplexer-based network 62 includes a plurality of multiplexers and demultiplexers to enable communication between the sub-cores. A sending sub-core uses a multiplexer in order to send signals through the network 62. A receiving sub-core uses a demultiplexer to receive the sent signal. The multiplexer-based network is not part of the user design being emulated. Rather, the sub-cores are programmed with the user design and elements of the user design in one sub-core can communicate with other elements of the user design in another sub-core only through a network that contains multiplexers and demultiplexers that are not part of the user design. The multiplexer-based network may or may not include a crossbar switch between the sending multiplexer and receiving demultiplexer for statically or dynamically programming the network. Alternatively, the multiplexers may be directly connected (hard-wired) to demultiplexers within the network.

Figure 5:
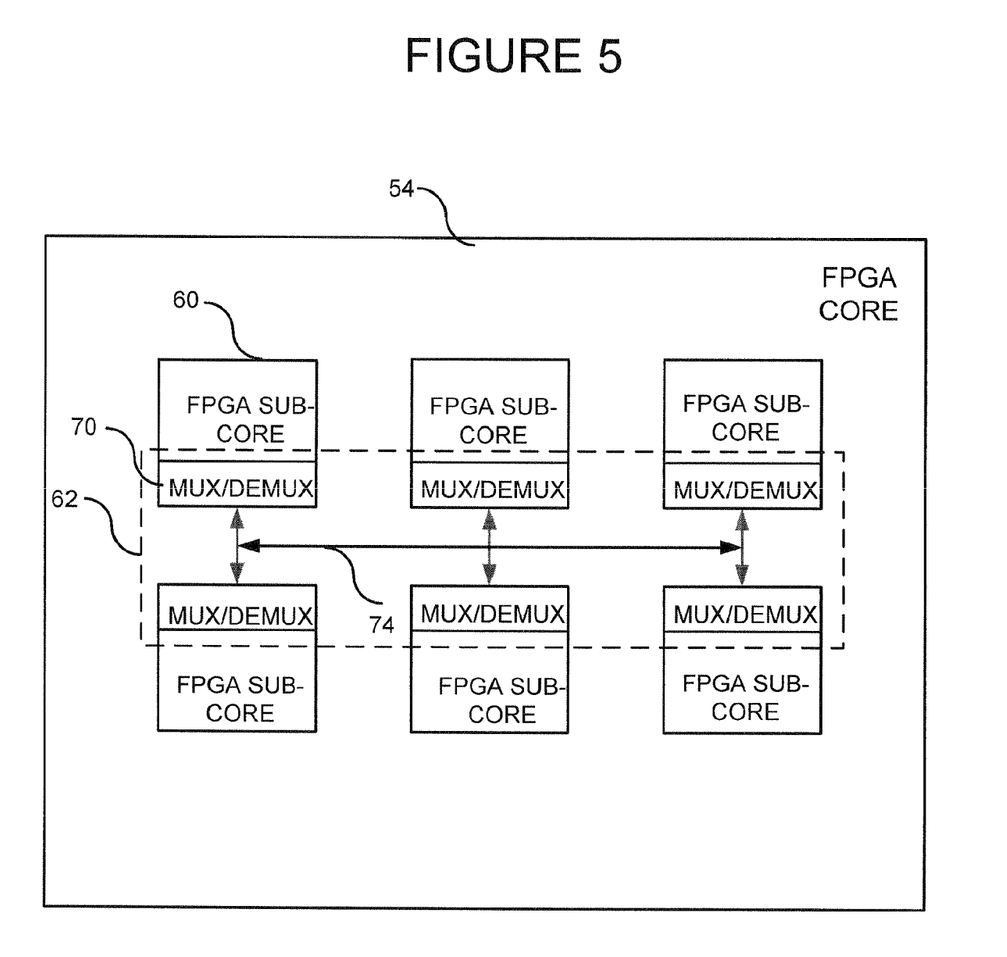
FIG. 5 shows further details of the multiplexer-based network.

FIG. 5 shows further details of the multiplexer-based network 62. Each FPGA sub-core 60 has an associated I/O 70 that is part of the network 62 and that includes a set of multiplexers and demultiplexers. Each FPGA sub-core 60 is not connectable to the other sub-cores in the FPGA core 54. The primary (and possibly only) means of communication between the sub-cores is through the multiplexer-based network 62. The I/O 70 represents the edge of the user model. More specifically, the user model is programmed into the sub-core 60. The I/O 70 has dedicated multiplexers and demultiplexers that are independent from or otherwise not associated with the user design, but only serve for communication from the sub-core 60 over the network 62. Physical routing 74 allows a connection between a multiplexer on a sending FPGA sub-core and a demultiplexer on a receiving FPGA core. The routing 74 may or may not include a crossbar switch or other logic elements (e.g., buffers, etc.).

Figure 6:
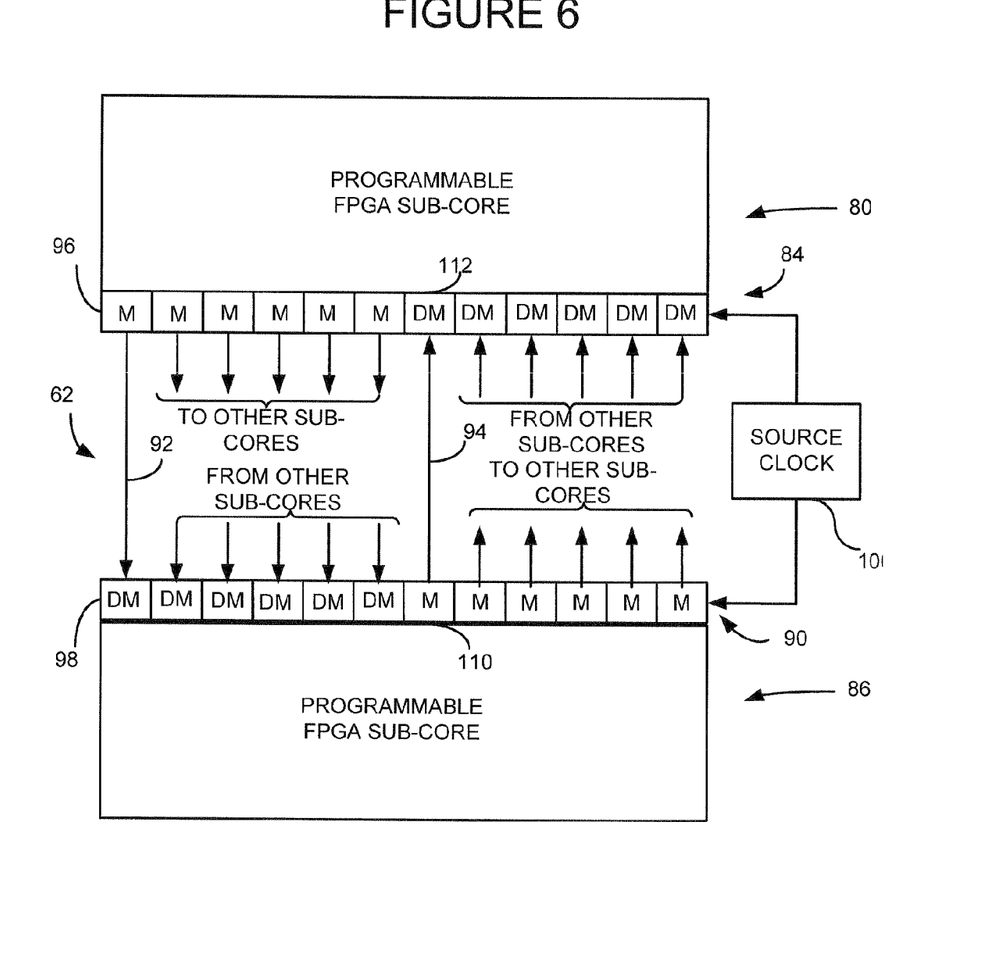
FIG. 6 is a specific example wherein each sub-core may include multiple multiplexers and demultiplexers.

FIG. 6 shows a particular embodiment of the multiplexer-based network 62. In this embodiment, a first sub-core 80 is adjacent to an I/O portion 84 of the network. The I/O portion 84 includes multiple multiplexers (designated with an "M") and demultiplexers (designated with a "DM") positioned on the periphery of the sub-core 80. A second sub-core 86 has an associated I/O portion 90, which is part of the network 62. The I/O portion 90 includes multiple multiplexers and demultiplexers for coupling to the network 62. As is shown at 92, 94, there are direct electrical connections between sub-core 80 and sub-core 86. Specifically, the multiplexer 96, which is part of I/O portion 84, is directly connected to a demultiplexer 98, which is part of I/O portion 90. Similarly, the FPGA sub-core 86 can communicate with sub-core 80 through a multiplexer 110 that is directly connected to a demultiplexer 112 on sub-core 80. The multiplexers in I/O portion 84 and I/O portion 90 are controlled by a source clock 100 used to coordinate the transmission timing. Of course, direct connection is not required and there may be logic elements or a crossbar switch between the multiplexer and demultiplexer.

Figure 7:
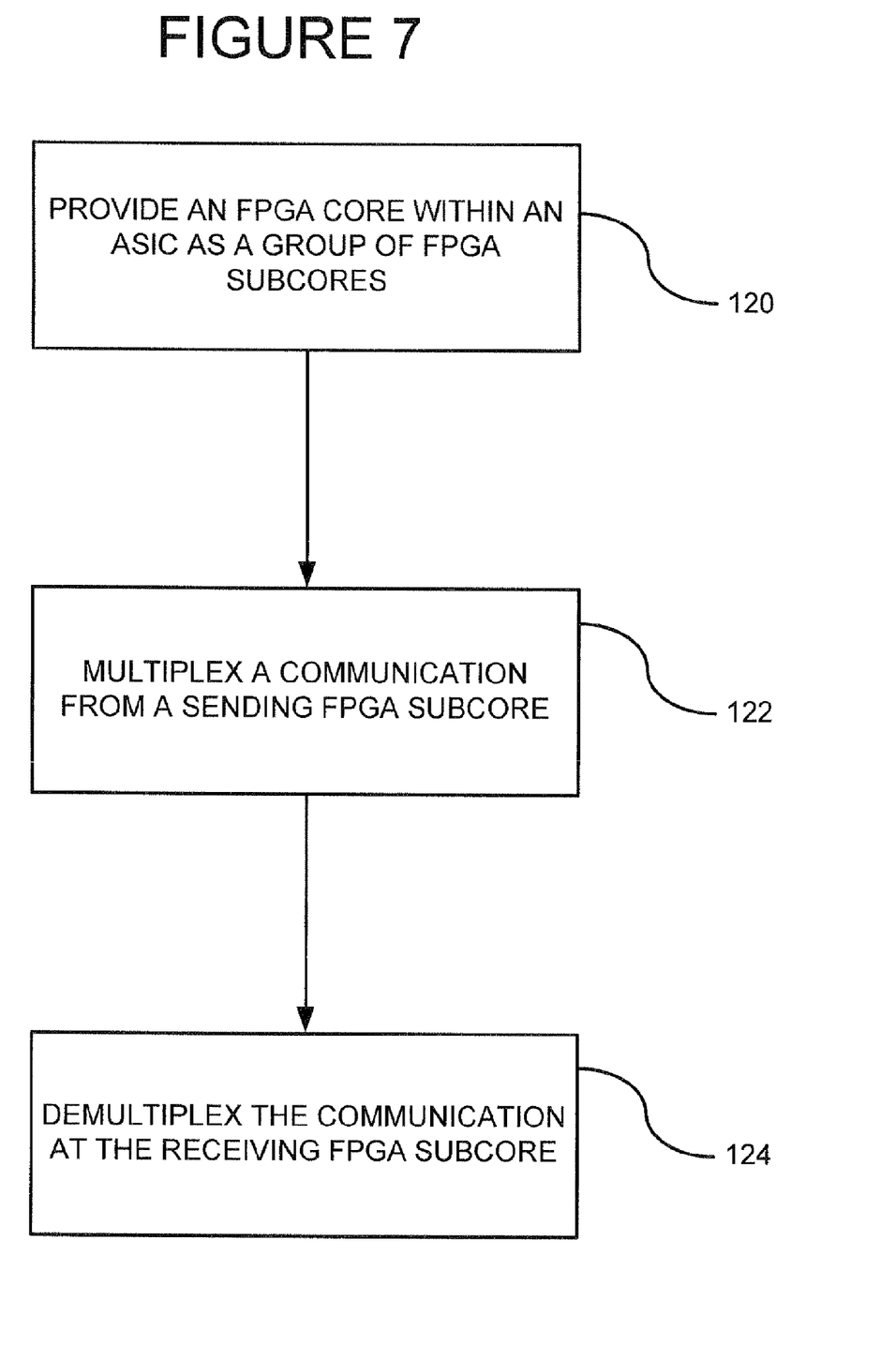
FIG. 7 is a flowchart of a method for communicating between programmable sub-cores within an integrated circuit.

FIG. 7 shows a flowchart of a method for communicating between sub-cores in an FPGA. In process block 120, an FPGA core is provided that has a plurality of FPGA sub-cores with a multiplexer-based network between the sub-cores. The FPGA core is a single die located within a single IC package. In process block 122, a communication from one sub-core is multiplexed and transmitted over the multiplexer-based network. In process block 124, the signal is received in another sub-core and demultiplexed.

Having illustrated and described the principles of the illustrated embodiments, it will be apparent to those skilled in the art that the embodiments can be modified in arrangement and detail without departing from such principles.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

We claim:

1. In an emulation environment, a communication scheme in a programmable core used to emulate a hardware design of a user, comprising:
    multiple programmable sub-cores within the programmable core, the programmable core being within a single integrated circuit; and
    a network, within the same integrated circuit, coupled between the programmable sub-cores for communication there between, the network including at least one multiplexer associated with a first of the programmable sub-cores and at least one demultiplexer associated with a second of the programmable subcores, wherein the programmable core is an FPGA positioned on a single semiconductor die within the integrated circuit and the network is for communication between sub-cores within the FPGA, wherein the network is without a crossbar switch.

2. The emulation environment of claim 1, wherein the network further includes a clock coupled to the multiplexer and demultiplexer for synchronization there between.

3. The emulation environment of claim 1, wherein each programmable sub-core includes a programmable portion for programming the hardware design that can only communicate with other sub-cores through the network.

4. The emulation environment of claim 1, further including an I/O portion in the network that includes multiple multiplexers for sending messages over the network and multiple demultiplexers for receiving messages from the network.

5. The emulation environment of claim 1, wherein the multiplexer and demultiplexer are not part of the hardware design of the user.

6. A method of communicating in a programmable core of an emulation environment, comprising:
    programming multiple programmable sub-cores in a single integrated circuit with a user design to be emulated; and
    communicating between the multiple programmed sub-cores over a multiplexer-based network, wherein the single integrated circuit is an FPGA positioned on a single semiconductor die with the sub-cores communicating within the FPGA, wherein the network includes a clock coupled to the multiplexer and demultiplexer to synchronize communication there between.

7. The method of claim 6, wherein communicating over the network includes multiplexing a signal from one of the programmed sub-cores onto a signal line and demultiplexing the signal in another of the programmed sub-cores.

8. The method of claim 6, wherein the communication between programmable cores occurs without traversing a crossbar switch.

9. The method of claim 6, further including receiving a clock signal in an I/O portion of the network to synchronize communication in the multiplexer-based network.

10. The method of claim 9, wherein the I/O portion includes multiplexers and demultiplexers that are not part of the user design.

11. An emulator, comprising:
    multiple printed circuit boards coupled together through a mid-plane or back-plane;
    multiple integrated circuits positioned on each of the printed circuit boards;
    an FPGA core within at least one of the integrated circuits;
    multiple sub-cores within the FPGA core, the sub-cores including a programmable portion;
    a network coupled between the multiple sub-cores, the network including a multiplexer associated with one of the sub-cores and a corresponding demultiplexer coupled to the multiplexer on another of the sub-cores, wherein the network includes a clock coupled to the multiplexer and demultiplexer to synchronize communication there between.

* * * * *